United States Patent [19]

Nakano et al.

[11] 4,336,465
[45] Jun. 22, 1982

[54] RESET CIRCUIT

[75] Inventors: Masao Nakano; Yoshihiro Takemae; Katsuhiko Kabashima, all of Kawasaki, Japan

[73] Assignee: Fujitsu Limited, Kawasaki, Japan

[21] Appl. No.: 61,252

[22] Filed: Jul. 27, 1979

[30] Foreign Application Priority Data

Jul. 28, 1978 [JP] Japan ................... 53-92308

[51] Int. Cl.³ .............................. H03K 5/00
[52] U.S. Cl. ................. 307/238.3; 307/450; 307/464; 307/530; 365/206
[58] Field of Search ............... 307/DIG. 3, 238, 450, 307/464, 495, 496, 497, 530, 238.1, 238.2, 238.6, 238.8; 365/205, 206, 207

[56] References Cited

U.S. PATENT DOCUMENTS

| 4,028,557 | 6/1977 | Wilson | 365/205 |
| 4,110,841 | 8/1978 | Schroeder | 365/205 |
| 4,139,911 | 2/1979 | Sciulli et al. | 307/238 |
| 4,162,416 | 7/1979 | Beecham et al. | 365/205 |
| 4,179,626 | 12/1979 | Oehler | 307/238 |
| 4,223,394 | 9/1980 | Pathak et al. | 307/238 |

OTHER PUBLICATIONS

IBM Technical Disclosure Bulletin, vol. 19, No. 2, 7/1976, p. 407, (Sense Amplifier for Capacitive Storage) by Arzubi.

Primary Examiner—Saxfield Chatmon, Jr.

[57] ABSTRACT

A reset circuit used for resetting, for example a memory device after a reading-out from a memory is effected, comprises fist and second reset transistors, for connecting first and second circuits to a common voltage source, and a short-circuit transistor, having a lower threshold voltage than the threshold voltage of said first and second reset transistors, for connecting said first and second circuits when said short circuit transistor receives the same input signal as supplied to said first and second reset transistors.

5 Claims, 7 Drawing Figures

RESET CIRCUIT

BACKGROUND OF THE INVENTION

1. Field of the Invention

The present invention relates to a reset circuit which is used in, for example, bit lines or data bus lines of memory devices of an integrated circuit device.

2. Description of the Prior Art

Reset circuits for resetting the state of a first and second circuit systems to an original state, and the operations of said reset circuits, are illustrated in FIGS. 1, 2, 3A and 3B. In FIG. 1, the first circuit system and the second circuit system are represented by the data bus line 1 and the data bus line 2, respectively, which are connected through the flip-flop 4 consisting of the FETs (field effect transistors) $Q_5$, $Q_6$, $Q_7$ and which $Q_8$ and has its two input and output terminals connected to the data bus lines 1 and 2, respectively. The reset circuit 3 comprises the FETs $Q_1$, $Q_2$ and $Q_3$, the gates of which are connected to a common terminal to which the clock signal $\phi_1$ is supplied. The FET $Q_9$ is connected to the FETs $Q_7$ and $Q_8$ which are included in the flip-flop 4. The clock signal $\phi_2$ which causes the flip-flop 4 to switch on and off is supplied to the gate of the FET $Q_9$.

The reset operation in the system shown in FIG. 1 is explained with reference to the waveforms illustrated in FIG. 2. It is presumed that the operation to read-out information from the memory through the data bus lines 1 and 2 is completed. At this moment, the voltage of the power source EL is $V_{DD}$, the voltage $V(1)$ of the first circuit 1 is "0" and the voltage $V(2)$ of the second circuit 2 is "$V_{DD}-V_{TH}$", where $V_{DD}$ is the drain supply direct current voltage of the FETs $Q_1$ and $Q_2$, $V_{Th6}$ is the threshold voltage of the FET $Q_6$. The reset operation is achieved if this condition is changed into the condition in which the potentials of the first circuit 1 and the second circuit 2 have the same value. In order to achieve the reset operation, at first, the clock signal $\phi_1$ having the value of $V_{DD}$ is supplied to the gates of the FETs $Q_1$, $Q_2$ and $Q_3$. Thus, the FET $Q_1$ in an OFF state is caused to become in an ON state, and the first circuit 1 is charged from the power source EL, and accordingly the potential $V(1)$ of the first circuit 1 rises to potential P. At the same time, the FET $Q_3$, which is in an OFF state is caused to become in an ON state, and the charge is caused to move from the second circuit 2 to the first circuit 1, and accordingly the potential $V(2)$ of the second circuit 2 falls to potential P. Thus, the FET $Q_2$ which is in an OFF state is caused to become in an ON state because of the lowering of the potential of the second circuit 2, and the charging commences of the both circuits 1 and 2 from the power source EL from the reset circuit 3. Accordingly, the potentials of the first circuit 1 and the second circuit 2 which were at the level P start together to rise up to the potential "$V_{DD}-V_{TH6}$" so that the reset operation is completed assuming that $V_{TH1}=V_{TH2}=V_{TH}$.

The problem of the system shown in FIG. 1 under the condition when the threshold voltages of the FETs $Q_1$, $Q_2$ and $Q_3$ are the same value $V_{TH}$ is as follows. That is, after the instant $t_3$ at which the first and the second circuits are reset to the potential "$V_{DD}-V_{TH}$", if the potential of the first circuit 1 rises up to the value "$V_{DD}-V_{TH}+\alpha$" as illustrated in the portion A of FIG. 2 because of some noise effect, due, for example to an electrostatic coupling with a neighbouring electirc circuits, while the potential of the second circuit 2 remains the value "$V_{DD}-V_{TH}$", it is possible that an erroneous judgement is incurred in the next reading-out of the memory. The cause of such an erroneous judgement is explained as follows. In order to read-out the memory cell storing information "0", the judgement of the potential of the first circuit 1 with reference to the potential of the second circuit 2 by means of flip-flop 4 is effected by lowering the potential of the first circuit to which said memory cell is connected and supplying the clock signal $\phi_2$ to the gate of the FET $Q_9$. If the potential of the first circuit was "$V_{DD}-V_{TH}+\alpha$" and the potential of the first circuit is then caused to fall to the value approximately "$V_{DD}-V_{TH}$" by the above-mentioned potential lowering, such potential of approximately "$V_{DD}-V_{TH}$" of the first circuit is not substantially lower than the potential "$V_{DD}-V_{TH}$" of the second circuit 2. Therefore, the erroneous judgement that the information stored in the above-mentioned memory cell is not "0" but "1" is incurred. The above-described reset circuit is disclosed in, for example, U.S. Pat. No. 3,678,473.

In other words, when the potential of the first circuit 1 is higher by $\beta$ than that of the second circuit 2 and if a low voltage which is smaller than $\beta$ is applied to the first circuit 1 to reduce the potential of the first circuit 1 and is amplified by the flip-flop 4 consisting of the FETs $Q_5$ through $Q_8$, the flip-flop 4 causes the potential of the first circuit 1 to become "1", i.e., "HIGH", and the potential of the second circuit 2 to become "0", i.e., "LOW". Contrary to this, when no unequality of the potential exists between the first circuit 1 and the second circuit 2 and if a low voltage is applied to the first circuit 1 to reduce the potential of the first circuit 1 and is amplified by the flip-flop 4, the flip-flop 4 causes the potential of the first circuit 1 to become "0", i.e., "LOW", and the potential of the second circuit 2 to become "1", i.e., "HIGH", so that a correct amplification takes place.

Since, in general, very low voltage signals are supplied from a memory cell to a bit line and from a bit line to a data bus line in a memory circuit, the erroneous operation described above can occur when an unequality of the potential exists between the first circuit 1 and the second circuit 2.

In order to avoid the above-mentioned erroneous judgement, the systems as shown in FIGS. 3A and 3B have been proposed. In the system shown in FIG. 3A, the gate signal $\phi_3$ for the FET $Q_3$ is selected higher than the gate signal $\phi_1'$ for the FETs $Q_1$ and $Q_2$. In the system shown in FIG. 3B, a FET $Q_4$ is connected between the first circuit 1 and the second circuit 2 in parallel with the FET $Q_3$. A gate signal $\phi_3'$ which is higher than the gate signal $\phi_1$ is supplied to the gate of the FET $Q_4$. Thus, in the systems shown in FIGS. 3A and 3B, it is possible to avoid the erroneous judgement which occurs in FIG. 1.

However, the systems shown in FIGS. 3A and 3B are not the best solutions of the problem, because in the systems shown in FIGS. 3A and 3B it is necessary to provide the gate signals $\phi_3$ and $\phi_3'$, to make the gate signals $\phi_3$ and $\phi_3'$ higher than the gate signals $\phi_1$ and $\phi_1'$, to provide electric conductors to supply the gate signals $\phi_3$, $\phi_3'$ to the gates of the FETs $Q_3$ and $Q_4$, and to acquire a predetermined space for locating the FET $Q_4$.

The present invention is proposed for the purpose of providing a solution to the above explained problems.

SUMMARY OF THE INVENTION

It is the principal object of the present invention to provide a reset circuit for resetting the state of two circuit systems to the original state, in which the erroneous operation, because of a noise effect due to, for example, an electrostatic coupling with the neighbouring electric circuits, is avoided without addition of either a supplemental FET or a supplemental signal source.

DESCRIPTION OF THE PREFERRED EMBODIMENTS

Figure 1:
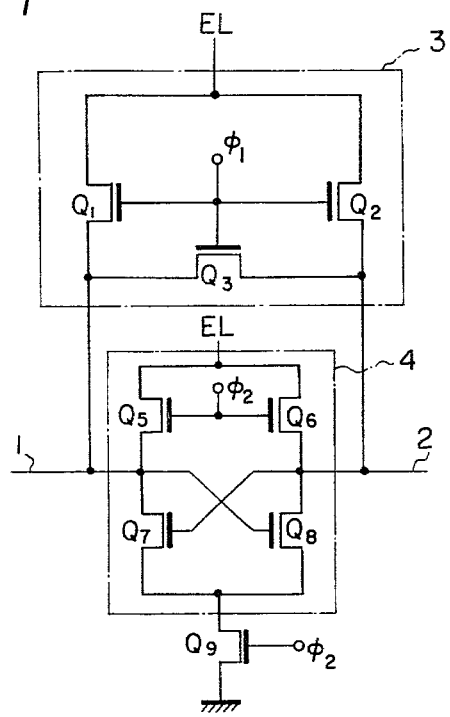
FIG. 1, which is presented for the purpose of illustrating both the background of the present invention as described hereinbefore and an embodiment of a reset circuit to which the present invention is applied as described hereinafter, shows a reset circuit for resetting the state of two circuit systems to the original state.

In the device shown in FIG. 1, the first and the second circuit are represented by the data bus lines 1 and 2, respectively, which connected together through the flip-flop 4 consisting of the FETs $Q_5$, $Q_6$, $Q_7$ and $Q_8$. The reset circuit 3 comprises the FETs $Q_1$, $Q_2$ and $Q_3$ the gates of which are connected together to form a common terminal to which the clock signal $\phi_1$ is supplied. The FET $Q_9$ is connected to the FETs $Q_7$ and $Q_8$ which are the constituents of the flip-flop 4. The clock signal $\phi_2$ which causes the flip-flop 4 to switch on and off is supplied to the gate of the FET $Q_9$.

With regard to the threshold voltages of the FETs $Q_1$, $Q_2$ and $Q_3$, the threshold voltage of the FETs $Q_1$ and $Q_2$ are selected higher than that of the FET $Q_3$. The ordinary value of the threshold voltage of an integrated circuit type FET is between 1.2 and 1.3 volts, and the variation of the value of said threshold voltage due to the condition of the FET manufacturing process is approximately tens of milli-volts. In the present invention, however, the threshold voltage $V_{TH}$ of the FETs $Q_1$ and $Q_2$ are selected, for example, between 2.2 and 2.8 volts, and the threshold voltage $V_{TH}$ of the FET $Q_3$ is selected, for example, between 1.2 and 1.3 volts. Thus, there exists a difference of, for example, 1 volt to 1.5 volts between the threshold voltage of the FETs $Q_1$ and $Q_2$ and that of the FET $Q_3$. The value of the threshold voltage is easily controlled by using the ion implantation method.

Figure 2:
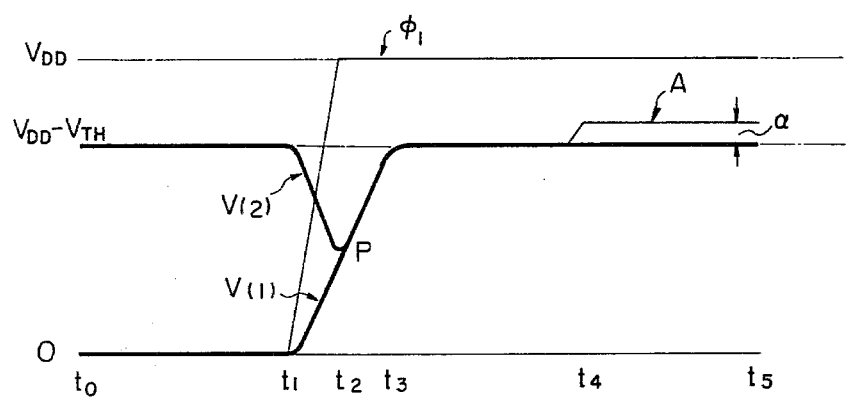
FIG. 2 shows the waveforms appearing in the circuit shown in FIG. 1.
Figure 3:
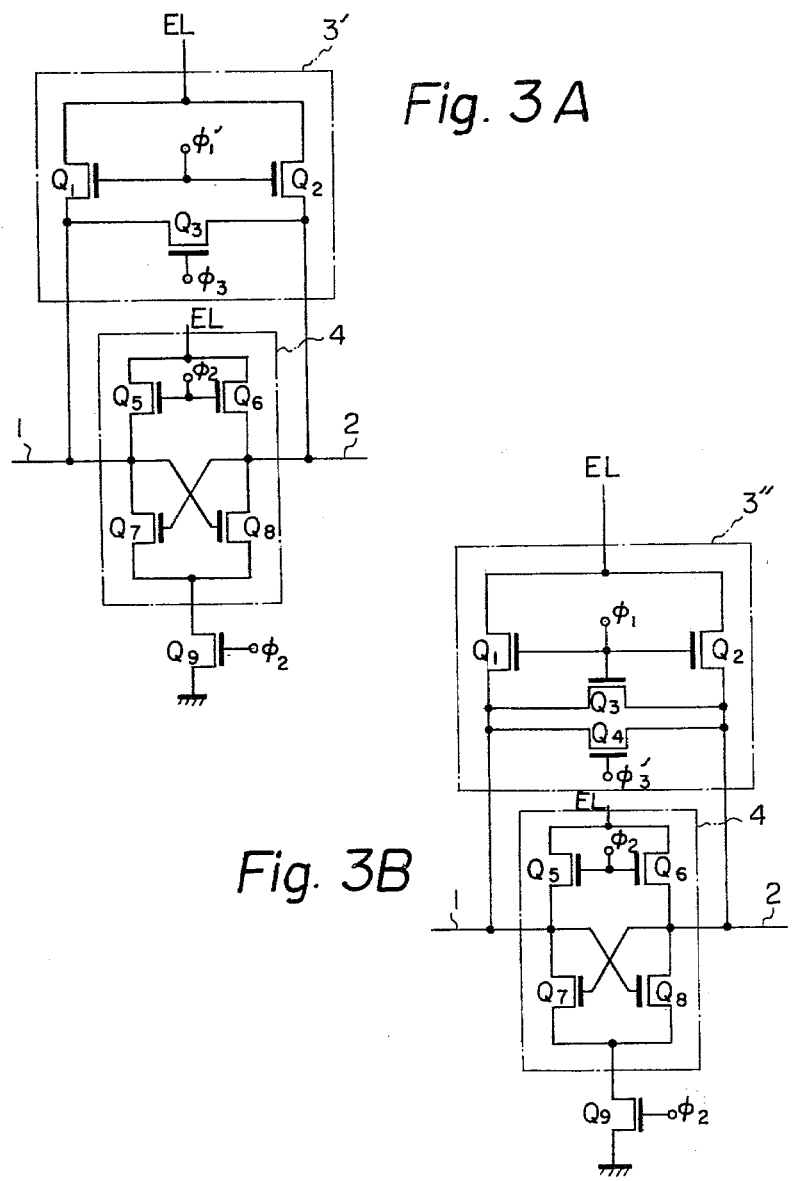
FIGS. 3A and 3B, which also illustrate the background of the present invention as described hereinbefore, show reset circuits for resetting the state of two circuit systems to the original state.

The operation of the device shown in FIG. 1 in accordance with the present invention is illustrated in FIG. 2. Since the threshold voltage of the FET $Q_1$ and $Q_2$ is selected higher than that of the FET $Q_3$, the FET $Q_3$ maintains its ON state even after the FETs $Q_1$ and $Q_2$ are caused to become in an OFF state in a reset operation. Thus, the charge in the first circuit 1 is allowed to move to the second circuit 2 through the conductive state FET $Q_3$, even when the potential of first circuit 1 is enhanced up to "$V_{DD}-V_{TH}+\alpha$" because of a noise voltage. Accordingly, the potentials of the first and the second circuit are rendered equal, unlike the case of the above explained prior art where the potential of the first circuit 1 is kept by voltage $\alpha$ higher than that of the second circuit 2. Therefore, in accordance with the present invention, no erroneous judgement, as explained above in connection with the prior art, is incurred and no modified circuits, as shown in FIGS. 3A and 3B, are necessary.

It should be noted that, after rising up to the value $V_{DD}$, the gate signal $\phi_1$ is maintained at said value $V_{DD}$ until it is caused to return to zero level immediately before the next reading-out.

A storing of an information into a memory cell is effected by a cutting-off of the memory cell from the first circuit 1 prior to the returning to "HIGH" of the reset clock signal $\phi_1$. (No storing of an information into a memory cell is effected by a turning-off of the reset clock signal $\phi_1$.)

Figure 4:
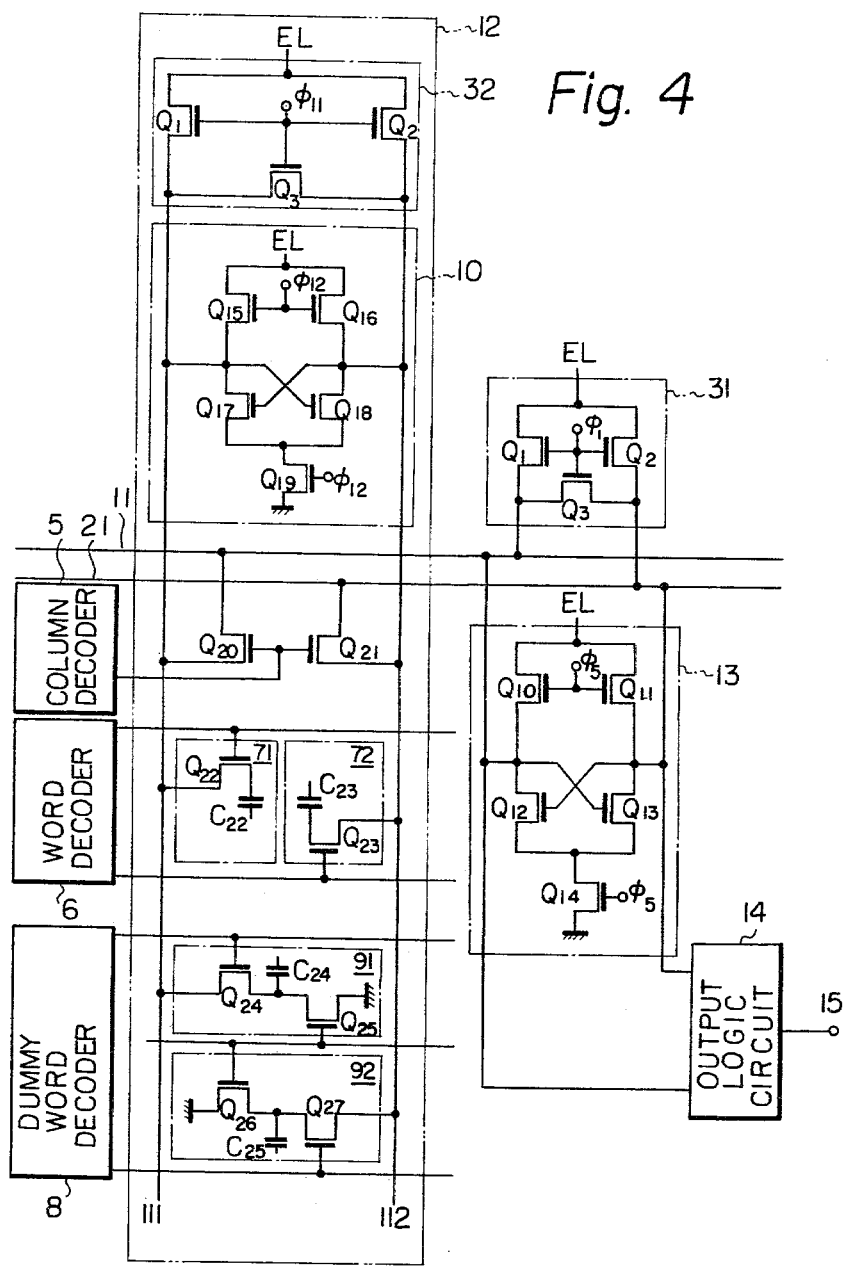
FIG. 4 shows an example of the integrated circuit type memory device in which the reset circuits are applied in accordance with the present invention.

In FIG. 4 an integrated circuit type memory device including the reset circuits in accordance with the present invention is illustrated. The memory unit 12 comprises the memory cells 71, 72, the dummy cells 91, 92 and the sense amplifier circuit 10. The memory cells 71, 72 are controlled by the word decoder 6 and the dummy cells 91, 92 are controlled by the dummy word decoder 8. The memory cells 71, 72 and the dummy cells 91, 92 are connected respectively to the bit lines 111 and 112. The memory unit 12 is connected to the read-out amplifier circuit 13 which is connected to the output logic circuit 14 which produces output information at the output terminal 15. The reset circuits 32 and 31 are provided corresponding to the sense amplifier circuit 10 and the read-out amplifier circuit 13, respectively.

Figure 5:
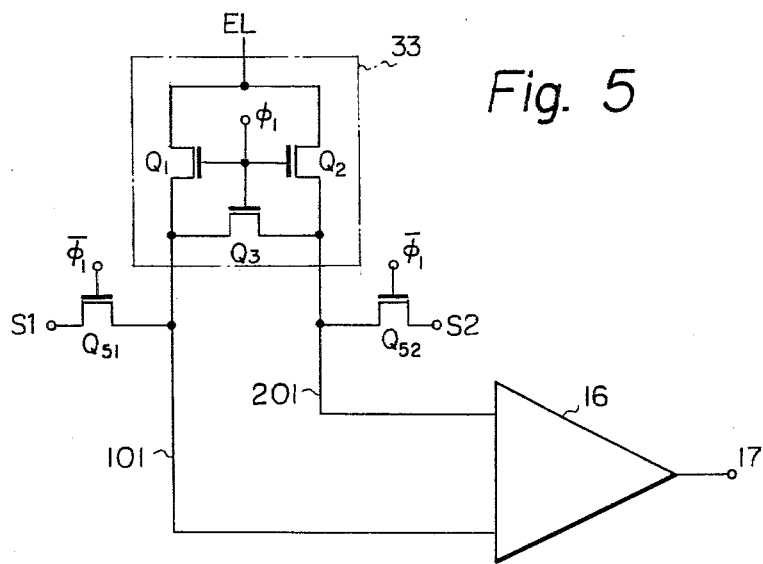
FIG. 5 shows another system in which the reset circuit is applied in accordance with the present invention.

In FIG. 5 an input circuit for a differential amplifier to which the reset circuit 33 in accordance with the present invention is illustrated. The signals S1 and S2 which are to be differentially amplified are supplied to the input circuits 101 and 201 of the differential amplifier 16 through the FETs $Q_{51}$ and $Q_{52}$. The reset FETs $Q_1$ and $Q_2$ and the short-circuit FET $Q_3$ of the reset circuit 33 are connected to the input circuits 101 and 201. In accordance with the present invention the value of the threshold voltage $V_{TH}$ of the FETs $Q_1$ and $Q_2$ is selected higher than that of the FET $Q_3$. The phase of the gate signal $\overline{\phi_1}$ supplied to the gates of the FETs $Q_{51}$ and $Q_{52}$ is opposite to that of the gate signal $\phi_1$ supplied to the gates of the FETs $Q_1$, $Q_2$ and $Q_3$.

Figure 6:
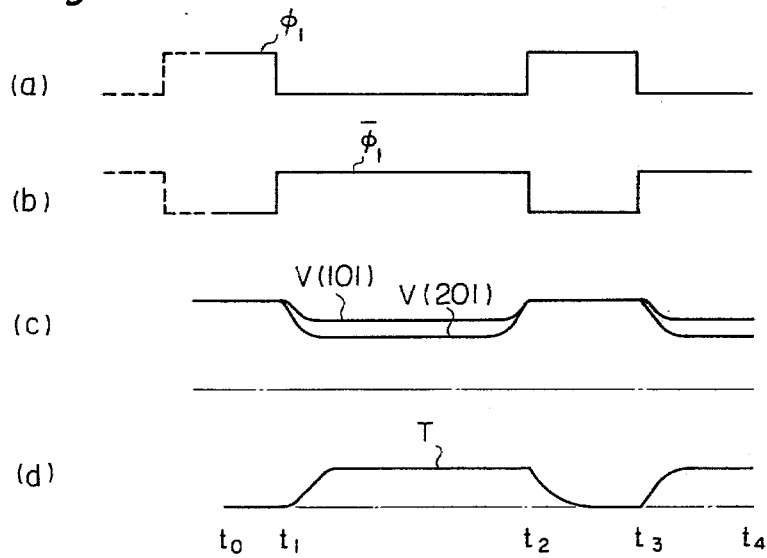
FIG. 6 shows the wave forms appearing in the circuit shown in FIG. 5.

The operation of the system shown in FIG. 5 is illustrated in FIG. 6. Due to the supply of the gate signal $\phi_1$ during the period from $t_0$ to $t_1$, the reset of the first and the second circuits 101 and 201 is effected, and accordingly, the potentials V(101) and V(201) of the first and the second circuits 101 and 201 are rendered equal. This is because, even if there exists a noise voltage in the first and the second circuits 101 and 201, the potentials of the first and the second circuits 101 and 201 are equalized due to the transfer of the charge through the FET $Q_3$ which is in an ON state. After the gate signal $\overline{\phi_1}$ is supplied to the gates of the FETs $Q_{51}$ and $Q_{52}$ at the moment $t_1$, the difference of the potentials V(101) and V(201) of the first and the second circuits 101 and 201 is amplified to produce an output signal T at the output terminal 17 during the period from $t_1$ to $t_2$. Accordingly, since the potentials V(101) and V(201) are equal for the period from $t_0$ to $t_1$ and are maintained equal even if there exists a noise voltage in one of the first and second circuits 101 and 201, no erroneous operation of the differential amplifier circuit for the period from $t_1$ to $t_2$ takes place.

What is claimed is:

1. A reset circuit for resetting the state of first and the second circuits by bringing the first and second circuits to a predetermined common potential, said reset circuit comprising first and second reset transistors for respectively connecting said first and second circuits to a common voltage source corresponding to said predetermined potential, a short circuit transistor, having a lower threshold voltage than the threshold voltages of said first and second reset transistors, for connecting in common said first and second circuits, and means for applying a signal simultaneously to said first and second reset transistors and to said short circuit transistor for causing conduction of said short circuit transistor to occur before conduction of said first and second reset transistors as a result of said difference in threshold voltages, said difference being due to selectively implanted ions in the manufacture of the respective transistors, wherein said threshold voltages of said first and second reset transistors are approximately in the range from 2.2 to 2.8 volts, and said threshold voltage of said short circuit transistor is approximately in the range from 1.2 to 1.3 volts.

2. A reset circuit as defined in claim 1, wherein said first and second circuits comprise respective bit lines of an integrated circuit type memory device.

3. A reset circuit as defined in claim 1, wherein said first and second circuits comprise respective data bus lines of an integrated circuit type memory device.

4. A reset circuit as defined in claim 1, wherein said first and second circuits comprise respective input lines of a differential amplifier circuit.

5. The circuit of claims 1, 2, 3 or 4, said threshold voltages of said first and second reset transistors being approximately in the range from 1 to 1.5 volts higher than said threshold voltage of said short circuit transistor.

* * * * *

UNITED STATES PATENT AND TRADEMARK OFFICE
CERTIFICATE OF CORRECTION

PATENT NO. : 4,336,465
DATED : 22 June 1982
INVENTOR(S) : MASAO NAKANO et al

It is certified that error appears in the above-identified patent and that said Letters Patent is hereby corrected as shown below:

Title Page, [57] ABSTRACT,
line 3, "fist" should be --first--.
Col. 1, line 10, after "of" delete "a";
line 17, after "and" delete "which";
line 18, after "and" (first occurrence) --which--;
line 28, "read-out" should be --read out--;
line 34, "$V_{Th6}$" should be --$V_{TH6}$--;
line 46, after "OFF state" insert --,--;
line 52, after "of" delete "the";
line 66, after "due" delete ","
Col. 2, line 4, "read-out" should be --read out--;
line 23, "$\beta$" should be --$\alpha$--;
line 24, "$\beta$" should be --$\alpha$--.
Col. 5, line 8, delete the second occurrence of "the".

*Signed and Sealed this*

*Eighth* Day of *February 1983*

[SEAL]

Attest:

GERALD J. MOSSINGHOFF

*Attesting Officer*   *Commissioner of Patents and Trademarks*